(12) United States Patent
Saitoh et al.

(10) Patent No.: US 11,903,299 B2
(45) Date of Patent: Feb. 13, 2024

(54) DISPLAY DEVICE

(71) Applicant: SHARP KABUSHIKI KAISHA, Sakai (JP)

(72) Inventors: Takao Saitoh, Sakai (JP); Masahiko Miwa, Sakai (JP); Masaki Yamanaka, Sakai (JP); Yi Sun, Sakai (JP); Yohsuke Kanzaki, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 476 days.

(21) Appl. No.: 17/292,973

(22) PCT Filed: Nov. 16, 2018

(86) PCT No.: PCT/JP2018/042516
§ 371 (c)(1),
(2) Date: May 11, 2021

(87) PCT Pub. No.: WO2020/100305
PCT Pub. Date: May 22, 2020

(65) Prior Publication Data
US 2022/0005887 A1 Jan. 6, 2022

(51) Int. Cl.
*H01L 29/08* (2006.01)
*H10K 59/88* (2023.01)
(Continued)

(52) U.S. Cl.
CPC .......... *H10K 59/88* (2023.02); *H10K 50/844* (2023.02); *H10K 59/124* (2023.02)

(58) Field of Classification Search
CPC .... H05B 33/12; H10K 50/844; H10K 59/122; H10K 59/124; H10K 59/131; H10K 59/88; H10K 71/70; H10K 59/12; H10K 71/00; H10K 59/1213; H10K 59/1201; H10K 2102/311; H10K 77/111; H10K 50/8426; H10K 59/40; H10K 59/00; H10K 59/38; H10K 50/84; H10K 59/123; H10K 59/35;
(Continued)

(56) References Cited

U.S. PATENT DOCUMENTS

| 2003/0180975 | A1 | 9/2003 | Fujita | |
| 2005/0095735 | A1 | 5/2005 | Fujita | |
| 2005/0258769 | A1* | 11/2005 | Imamura | H05B 45/60 315/161 |

(Continued)

FOREIGN PATENT DOCUMENTS

| GB | 0608134 | 6/2006 |
| JP | 2003-233331 A | 8/2003 |

(Continued)

*Primary Examiner* — Niki H Nguyen
(74) *Attorney, Agent, or Firm* — ScienBiziP, P.C.

(57) ABSTRACT

A TEG near the perimeter of a frame region is away from a TFT, which is disposed in a display region and is actually used for screen display. Hence, the characteristics of the TEG can change in a manner different from that in the characteristics of the TFT within the display region. Accordingly, provided is a display device that includes a TEG pattern disposed between the display region and a trench, and includes a dummy pixel circuit disposed between the display region and a barrier wall. The TEG pattern is outside the display region and is adjacent to at least the dummy pixel circuit.

16 Claims, 9 Drawing Sheets

(51) Int. Cl.
*H10K 50/844* (2023.01)
*H10K 59/124* (2023.01)

(58) Field of Classification Search
CPC .......... H10K 59/126; H10K 2102/351; H10K 50/00; H10K 50/865; H10K 50/11; H10K 50/8445; H10K 59/121; H10K 59/1216; H10K 59/1315; H10K 50/805; H10K 71/135; H10K 59/353; H10K 59/65; H10K 71/166; H10K 71/80; H10K 2102/3026; H10K 2101/10; H10K 50/86; H10K 50/8428; H10K 2102/00; H10K 50/81; H10K 50/80; H10K 50/846; H10K 71/851; H10K 59/18; H10K 59/351; H10K 50/824; H10K 85/6572; H10K 50/841; H10K 50/818; H10K 50/17
See application file for complete search history.

(56) References Cited

U.S. PATENT DOCUMENTS

| | | | |
|---|---|---|---|
| 2007/0178614 A1* | 8/2007 | Arasawa | H01L 22/32 438/17 |
| 2014/0027720 A1* | 1/2014 | Kim | H10K 59/88 257/E51.001 |
| 2015/0060823 A1 | 3/2015 | Furuie | |
| 2015/0091030 A1 | 4/2015 | Lee et al. | |
| 2018/0151850 A1* | 5/2018 | Lee | H10K 59/30 |
| 2019/0215472 A1* | 7/2019 | Lee | H04N 25/76 |
| 2019/0331974 A1 | 10/2019 | Furuta et al. | |
| 2021/0351252 A1* | 11/2021 | Koike | H05B 33/22 |

FOREIGN PATENT DOCUMENTS

| | | |
|---|---|---|
| JP | 2008-089634 A | 4/2008 |
| JP | 2015-049948 A | 3/2015 |
| WO | 2018/030207 A1 | 2/2018 |

* cited by examiner

DISPLAY DEVICE

TECHNICAL FIELD

The disclosure relates to a display device.

BACKGROUND ART

A conventional display device has a frame region in which a test element group (TEG) is disposed near its perimeter, which is the outside of a sealing film constituting a scan-line drive circuit or pixel circuit. A TEG is used for evaluating the characteristics of a thin film transistor (TFT), which regulates current supplied to a pixel.

CITATION LIST

Patent Literature

Patent Literature 1: Japanese Patent Application Laid-Open No. 2003-233331

SUMMARY

Technical Problem

The TEG near the perimeter of the frame region is away from the TFT, which is disposed in the display region and is actually used for screen display. Hence, the characteristics of the TEG can change in a manner different from that in the characteristics of the TFT within the display region.

Unfortunately, it is possible that a characteristic value measured from such a conventional TEG does not exactly reflect the characteristics of the TFT within the display region.

Solution to Problem

To solve the above problem, the disclosure provides a display device that includes the following: a substrate; a stack of a flattening film, a first electrode, an edge cover, and a second electrode, the stack being disposed on the substrate; a sealing layer disposed on the second electrode, the sealing layer including a first insulating sealing film, an organic film, and a second insulating sealing film; a display region; and a frame region surrounding the display region. The display region includes a pixel circuit including a plurality of transistors. The frame region includes the following: a trench disposed in the flattening film so as to surround the display region; a first conductive film electrically connected to the second electrode in the trench, the first conductive film being made of a material identical to the material of the first electrode, the first conductive film being disposed in a layer identical to a layer where the first electrode is disposed; a barrier wall defining an end of the organic film so as to surround the outside of the trench; a TEG pattern disposed between the display region and the trench; and a dummy pixel circuit disposed between the display region and the barrier wall, the dummy pixel circuit having a configuration identical to the configuration of the pixel circuit, the dummy pixel circuit including a transistor. The TEG pattern is adjacent to at least the dummy pixel circuit.

Advantageous Effect of Disclosure

The disclosure enables the TEG pattern to be placed in a region close to the dummy pixel circuit and pixel circuit. This offers a characteristic value reflecting the characteristics of TFTs, which constitute the pixel circuit within the display region.

Consequently, problems relating to the display characteristic of the display device can be grasped exactly, improving the display performance of the display device and enhancing development speed.

In particular, placing the TEG pattern near a corner of a notch disposed in the display region enables the four sides of the TEG pattern, that is, the upper, lower, right and left sides, to be surrounded by the dummy pixel circuit or pixel circuit. This enables the operating environment of the TEG pattern to be more close to the operating environment of the pixel circuit. Consequently, a characteristic value of the TFT, constituting the pixel circuit within the display region, can be exactly grasped from the TEG pattern.

DESCRIPTION OF EMBODIMENTS

The embodiments of the disclosure will be detailed with reference to the drawings. Throughout the Description and drawings, components of the substantially same function will be denoted by the same sings and their redundancies will not be described.

First Embodiment

Figure 1:
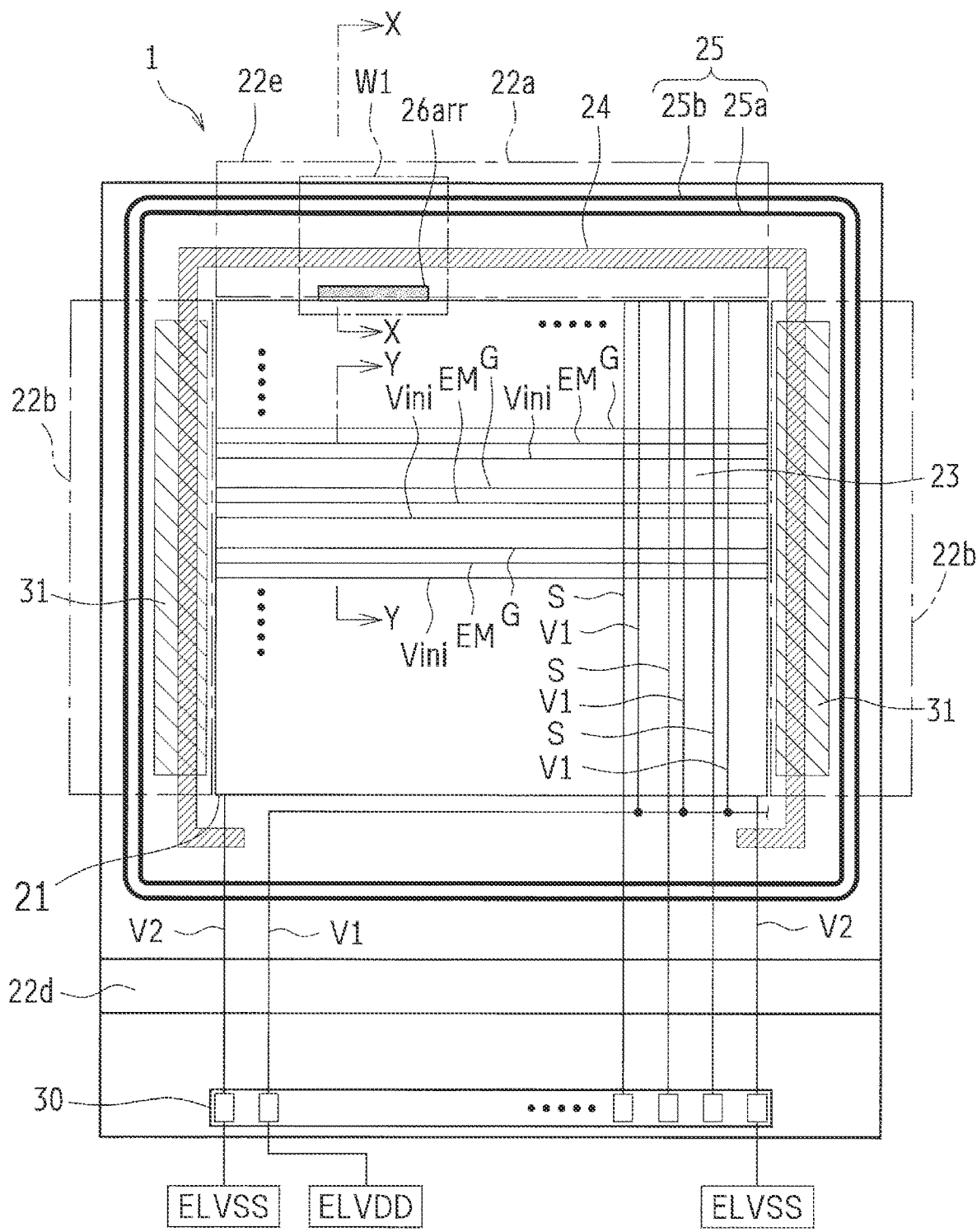
FIG. 1 schematically illustrates the overall structure of a display device 1 according to a first embodiment.

FIG. 1 illustrates a display device 1, which has a display region 21 and a frame region 22 surrounding the display region 21. The frame region 22 includes, at its end, a terminal section 30 for inputting external signals. The frame region 22 also includes a bending portion 22d between the terminal section 30 and display region 21. The display region 21 includes a plurality of scan signal lines G, a plurality of light-emission control lines EM, and a plurality of initialization signal lines Vini, all extending laterally. The display region 21 also includes a plurality of data signal lines S and a plurality of first power-source voltage lines V1, all extending longitudinally. The display region 21 further includes pixel circuits 23 each having a plurality of transistors, and includes light-emitting elements 3. Each pixel circuit 23 and each light-emitting element 3 are provided so as to correspond to the intersection between the scan signal line G and data signal line S.

Figure 2:
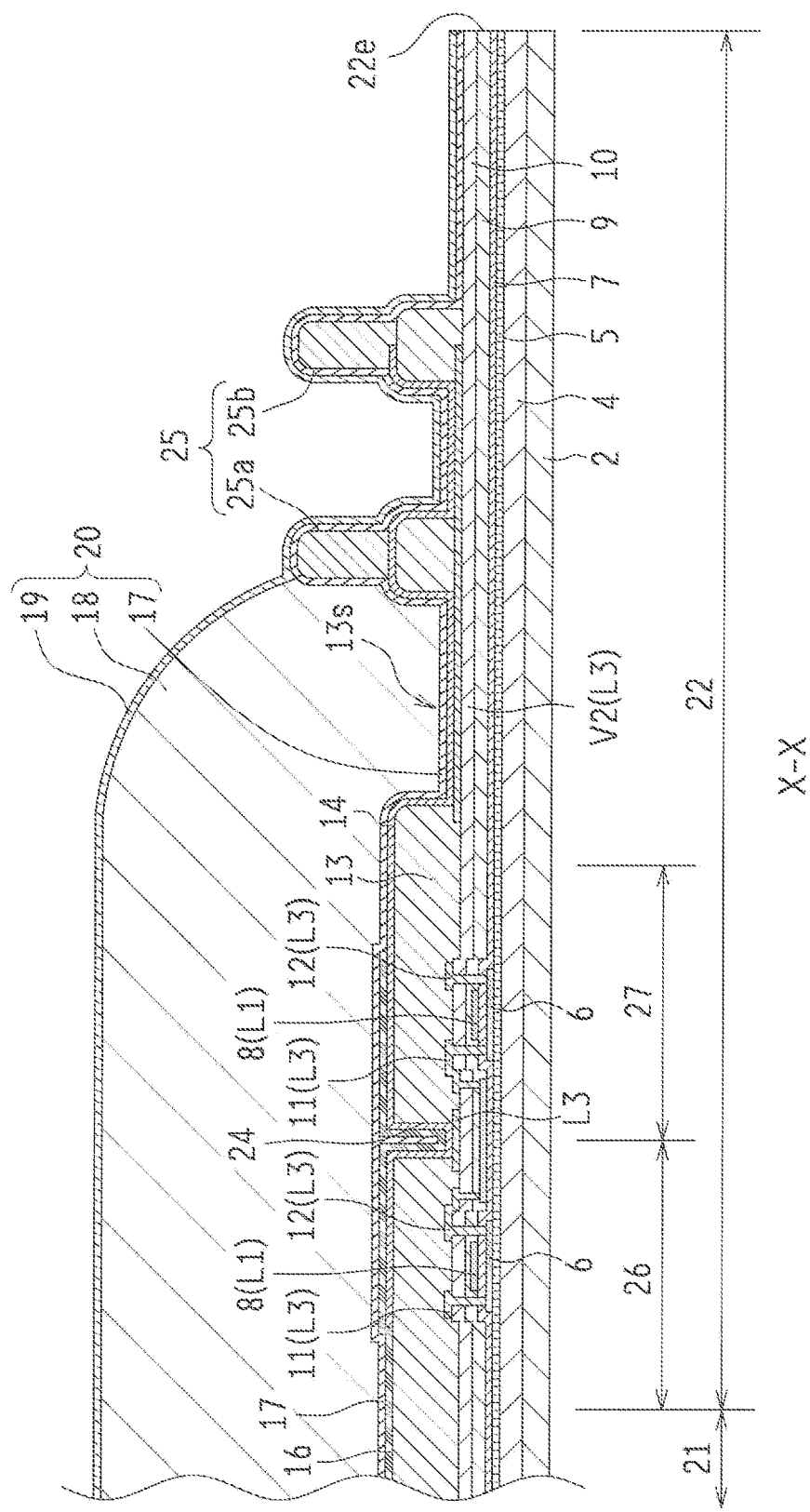
FIG. 2 is a sectional view taken along line X-X in FIG. 1, and illustrates the structures of a TEG pattern 26 and dummy pixel circuit 27 extending from a display region 21 to an end side 22e of a frame region 22.
Figure 3:
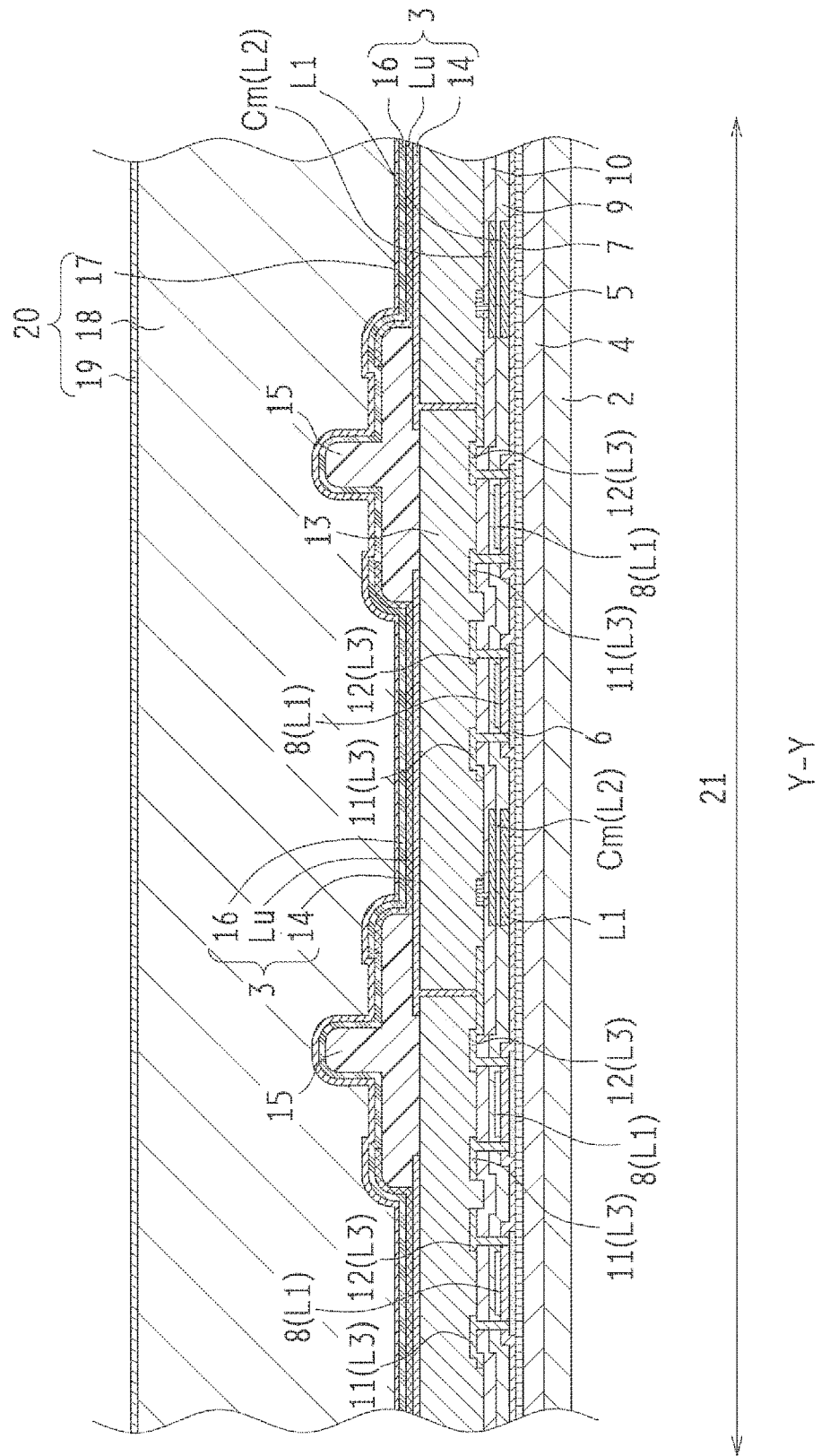
FIG. 3 is a sectional view taken along line Y-Y in FIG. 1, and illustrates the structures of a pixel circuit 23 and light-emitting element 3 in the display region 21.
Figure 4:
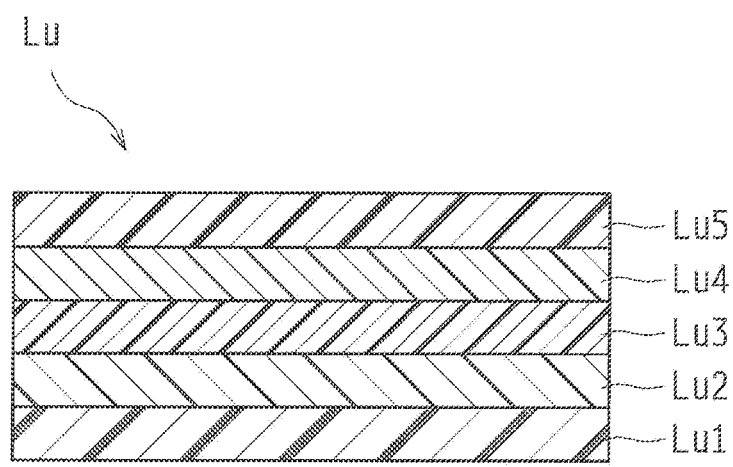
FIG. 4 illustrates the laminated structure of the light-emitting element 3.

FIGS. 2 and 3 illustrate a substrate 2, on which the following components are stacked: a resin layer 4; a base coat layer 5; a semiconductor layer 6; a gate insulating film 7; a first wire L1 (a gate electrode 8, the scan signal line G, and the light-emission control line EM); a first inorganic insulating film 9, a second wire L2 (the initialization power-source line Vini and a capacitance electrode Cm); a second inorganic insulating film 10, a third wire L3 (a source electrode 11, a drain electrode 12, the data signal line S, and the first power-source voltage line V1); and a flattening film 13. A transistor T includes the semiconductor layer 6, the gate insulating film 7, and the gate electrode 8.

As illustrated in FIG. 3, each light-emitting element 3 includes a first electrode 14, a light-emitting layer Lu, and a second electrode 16, which is common to the plurality of light-emitting elements 3. The light-emitting layer Lu includes an organic EL layer for instance. The light-emitting layer Lu is composed of an organic EL layer for instance, in the following embodiments as well. The light-emitting layer Lu has a structure in which the following components are stacked on the first electrode 14, as illustrated in FIG. 14: an electron injection layer Lu1, an electron transport layer Lu2, a light-emitting layer Lu3, a hole transport layer Lu4, and a hole injection layer Lu5.

Disposed between the first electrode 14 and light-emitting layer Lu is an edge cover 15, as illustrated in FIG. 3. The edge cover 15 covers the edge of the first electrode 14, and has an opening exposing the first electrode 14 so as to define a light-emission region. Each pixel circuit 23 includes a drive transistor T1. Upon application of a potential to a control terminal of the drive transistor T1, current flows from the first power-source voltage line through the first electrode 14 and light-emitting layer Lu to the second electrode 16 to cause the light-emitting element 3 to emit light.

Also provided is a sealing layer 20, which seals the plurality of light-emitting elements 3. The sealing layer 20 includes a first insulating sealing film 17, an organic film 18, and a second insulating sealing film 19.

The resin layer 4, the flattening film 13, and the edge cover 15 are composed of an organic resin layer of, for instance, acrylic or polyimide.

The base coat layer 5, the gate insulating film 7, the first inorganic insulating film 9, and the second inorganic insulating film 10 are composed of an inorganic insulating monolayer film of, for instance, silicon nitride, silicon oxide or silicon oxide nitride, or is composed of an inorganic insulating laminated film of these materials.

The semiconductor layer 6 is composed of, but not limited to, an oxide semiconductor of In—Ga—Zn—O for instance, or composed of polysilicon.

The first wire L1, the second wire L2, and the third wire L3 are composed of a monolayer film of metal (including an alloy), including titanium, molybdenum, tungsten, tantalum, niobium, aluminum, copper, and silver, or composed of a laminated film of these materials.

The first electrodes 14 and the second electrodes 16 are composed of a transparent electrode of, for instance, indium tin oxide (ITO), composed of a metal material (including an alloy), including silver and aluminum, or composed of a laminated film of these materials.

In the frame region 22, the flattening film 13 has a trench 24 surrounding the display region 21. The trench 24 is a groove that blocks moisture and oxygen entering the flattening film 13 of organic resin, and that avoids degradation in the light-emitting elements 3, constituting the pixel circuits 23.

In the trench 24 and near the trench 24, a first conductive film 14 is electrically connected to the second electrode 16. The first conductive electrode 14 is made of the same material and disposed in the same layer as the first electrode 14. Moreover, disposed around the outside of the trench 24 is a barrier wall 25 defining the end of the organic film 18. The flattening film 13 has a slit 13s disposed between the barrier wall 25 and display region 21. In the slit 13s, a second power-source trunk wire V2 is disposed that is made of the same material and disposed in the same layer as the third wire L3. The second electrode 16 is electrically connected to the second power-source trunk wire V2 via the first conductive electrode 14. The second power-source trunk wire V2 receives a second power-source voltage from a terminal of the terminal section 30. In this embodiment, the barrier wall 25 is a dual-ply wall, the inside of which is a barrier wall 25a surrounding the end of the organic film 18.

Each first power-source voltage line V1 is electrically connected to a first power-source trunk wire V1 in the frame region 22. The first power-source trunk wire V1 receives a first power-source voltage from a terminal of the terminal section 30. When the first electrode 14 is an anode, and the second electrode 16 is a cathode, the first power-source voltage is a high power-source voltage ELVDD, and the second power-source voltage is a low power-source voltage ELVSS. When the first electrode 14 is a cathode, and the second electrode 16 is an anode, the first power-source voltage is a low power-source voltage ELVSS, and the second power-source voltage is a high power-source voltage ELVDD.

Figure 5:
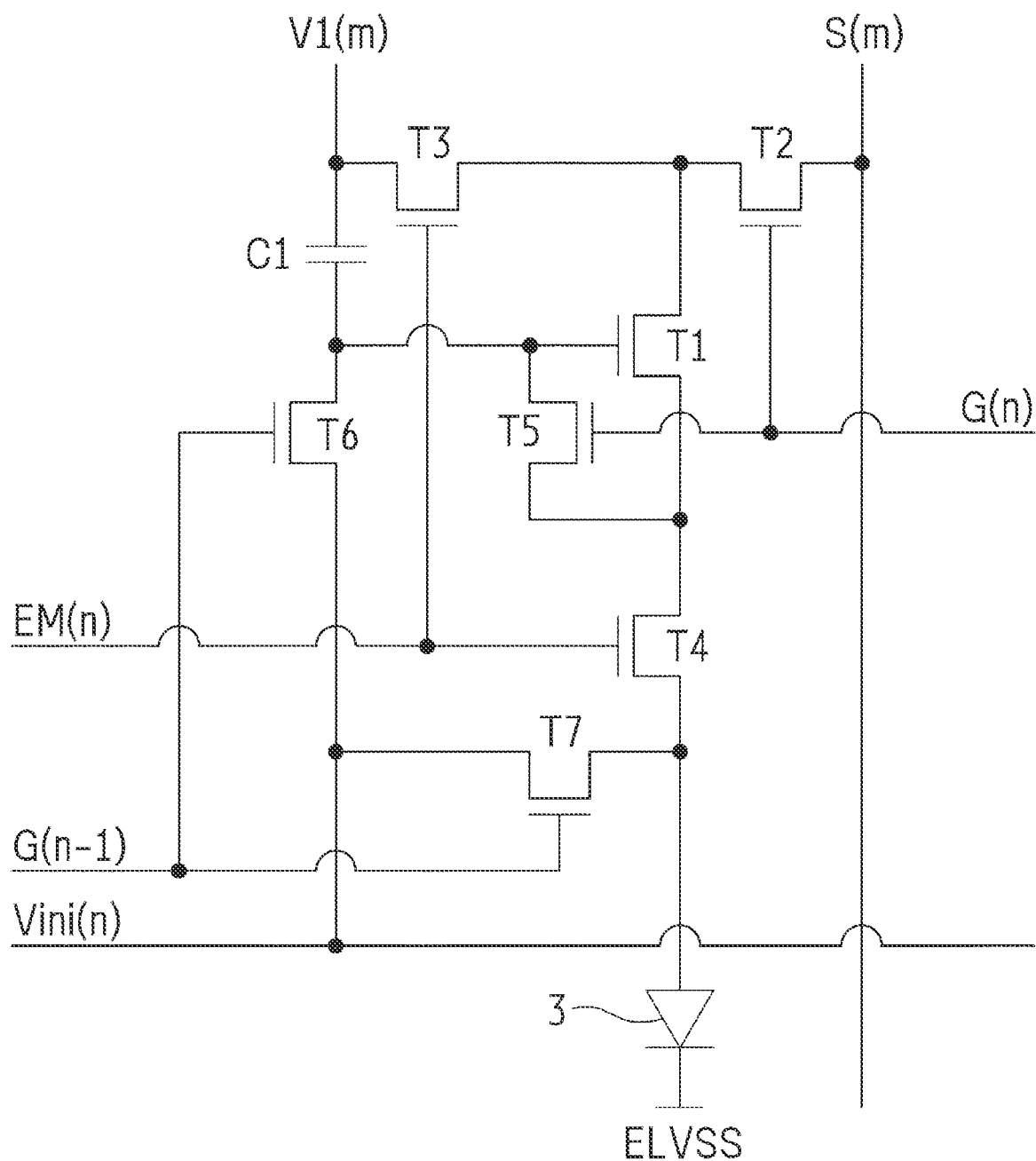
FIG. 5 is a circuit diagram of an example pixel circuit 23.

The following describes the configuration of the pixel circuits 23. FIG. 5 is a circuit diagram illustrating the configuration of the pixel circuit 23 in Column m of Row n. The configuration of the pixel circuit 23 herein is an example; thus, other publicly known configurations can be used. The pixel circuit 23 in FIG. 5 includes the following: one light-emitting element 3; seven transistors T1 to T7 (i.e., a drive transistor T1, a write control transistor T2, a power-supply control transistor T3, a light-emission control transistor T4, a threshold-voltage compensation transistor T5, and initialization transistors T6 and T7); and one capacitor C1. The transistors T1 to T7 are p-channel transistors. The capacitor C1 is a capacitive element having two electrodes. The light-emission control line EM (n) is connected to a control terminal of T3 and a control terminal of T4. The scan signal line G (n) is connected to a control terminal of T2 and a control terminal of T5. The scan signal line G (n-1) is connected to a control terminal of T6 and a control terminal of T7. Here, the control terminal of T7 may be connected to the scan signal line G (n). The initialization power-source line Vini (n) is connected to one of continuity terminals of T6 and one of continuity terminals of T7. The data signal line S (m) is connected to one of continuity terminals of T2. The first power-source voltage line V1 (m) is connected to one of continuity terminals of T3.

It is noted that the foregoing internal-compensation pixel circuit 23 is an example. Another internal-compensation pixel circuit may be used, or an external-compensation pixel circuit may be used. It is also noted that the foregoing transistors may be n-channel transistors.

Figure 6:
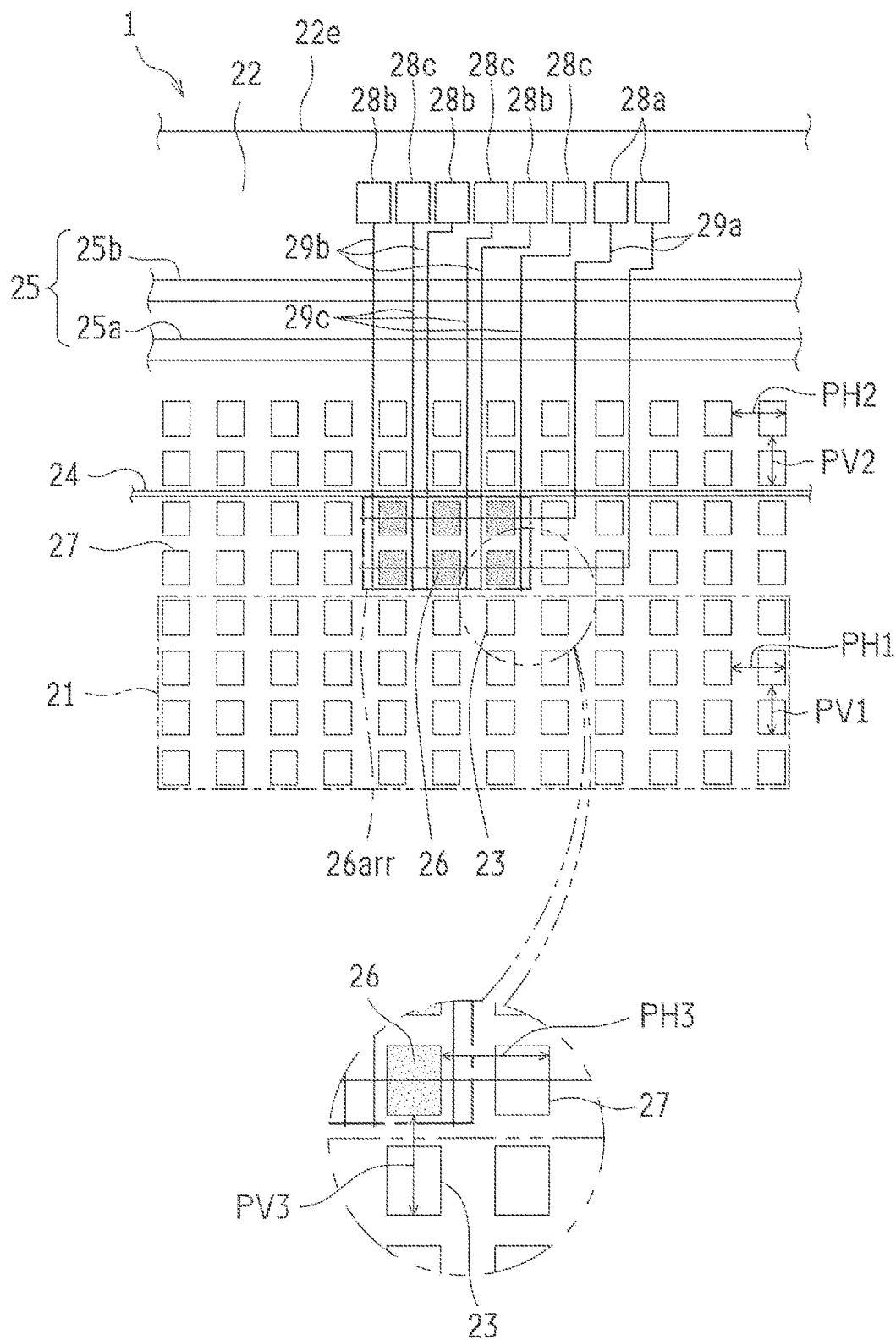
FIG. 6 is an enlarged view of a region W1, which is denoted by a dot-dashed line in FIG. 1.

FIG. 6 is an enlarged view of a region W1, which is denoted by a dot-dashed line in FIG. 1.

As illustrated in FIGS. 2 and 6. TEG patterns 26 are disposed in a region between the display region 21 and trench 24, and dummy pixel circuits 27 each having the same configuration (transistors, a capacitor, and wires) as the pixel circuit 23 and each including a plurality of transistors are disposed in a region between the display region 21 and barrier wall 25a. As illustrated in FIG. 6, the dummy pixel circuits 27 are disposed also in a region between the display region 21 and trench 24, and are adjacent to the TEG patterns 26.

The display region 21 has a rectangular shape in this embodiment, as illustrated in FIG. 1. A region (TEG pattern region 26arr) where the TEG patterns 26 are disposed is in a frame region 22a located on a side that is across the display region 21 from the terminal section 30. Moreover, control circuits 31 (including a scan control circuit that inputs a signal to the scan signal lines, and a light-emission control circuit that inputs a signal to the light-emission control lines) are in frame regions 22b located on sides orthogonal to the side on which the frame region 22a is located. The control circuits 31 are provided with the display region 21 interposed therebetween.

FIG. 6 shows a plurality of TEG patterns 26 arranged in the TEG pattern region 26arr, which is denoted by a dot-dashed line forming a rectangle. In this embodiment, one of the TEG patterns 26 is provided as a unit consisting of a region of the same size as a region occupied by a single pixel circuit 23. Moreover, a region occupied by one of the pixel circuits 23 and a region occupied by one of the dummy pixel circuits 27 have the same size.

A horizontal pitch of arrangement PH1 between the pixel circuits 23 and a horizontal pitch of arrangement PH2 between the dummy pixel circuits 27 are equal, as illustrated in FIG. 6; likewise, a perpendicular pitch of arrangement PV1 between the pixel circuits 23 and a perpendicular pitch of arrangement PV2 between the dummy pixel circuits 27 are equal.

This enables an influence exerted by a process for manufacturing the surroundings of the TEG patterns 26 to be the same as that exerted by a process for manufacturing the pixel circuits 23 within the display region 21. Accordingly, obtaining the electrical properties of the TEG patterns 26 during the manufacturing process can accurately grasp a characteristic change in the pixel circuits 23. In addition, the lifetime characteristic of the pixel circuits 23 and other things can be grasped from the TEG patterns 26 even after the manufacturing process. The TEG patterns 26 are hence disposed outside the display region 21, and are adjacent to at least the dummy pixel circuits 27 or pixel circuits 23. The TEG pattern 26 in this embodiment has at least one side adjacent to the pixel circuit 23 as well, which is disposed in the display region 21. Such a configuration can offer a higher degree of accuracy of grasping a characteristic change in a pixel circuit 23 than a configuration where the surroundings are all dummy pixel circuits 27.

In this embodiment, the TEG pattern 26 is horizontally adjacent to the dummy pixel circuit 27 or pixel circuit 23 with a horizontal pitch PH3, which is the same as the horizontal pitch PH1 between the pixel circuits 23. Furthermore, the TEG pattern 26 is perpendicularly adjacent to the dummy pixel circuit 27 or pixel circuit 23 with a perpendicular pitch PV3, which is the same as the perpendicular pitch PV1 between the pixel circuits 23. This can bring the environment around the TEG patterns 26 close to the environment of the TFTs constituting the pixel circuits 23.

It is noted that a second embodiment described below provides such an effect as well obtained by the coincidence between the horizontal pitches and the coincidence between the perpendicular pitches.

FIG. 6 shows that an inspection pad 28 capable of supplying current to the TEG patterns 26 is disposed between the barrier wall 25 and an end side 22e of the frame region 22. The inspection pad 28 is composed of a conductor, and is assigned to any of three kinds of pad: gate pads 28a, source pads 28b, and drain pads 28c. The gate pads 28a are connected to the first wires L1 (gate electrodes 8) of the TEG patterns 26 via conductive wires 29a. The source pads 28b are connected to the source electrodes 11 of the TEG patterns 26 via conductive wires 29b. The drain pads 28c are connected to the drain electrodes 12 of the TEG patterns 26 via conductive wires 29c. FIG. 2 illustrates an example structure of a transistor included in each TEG pattern 26.

The dummy pixel circuits 27 may be disposed in a region between the trench 24 and barrier wall 25, as illustrated in FIG. 6.

The dummy pixel circuits 27 may be disposed under the trench 24.

Second Embodiment

The following describes a second embodiment of the disclosure. For convenience in description, components having the same functions as those described in the foregoing embodiment will be denoted by the same signs, and their details have already described.

The display device 1 according to the second embodiment has a notch 34, a dented cut, disposed on a part of a side of the display region 21. The trench 24 and the barrier wall 25 are disposed along a side forming the outline of the notch 34. Here, a region 32, denoted by a dot-dashed line, in FIG. 7 will be referred to as a notch region.

Figure 7:
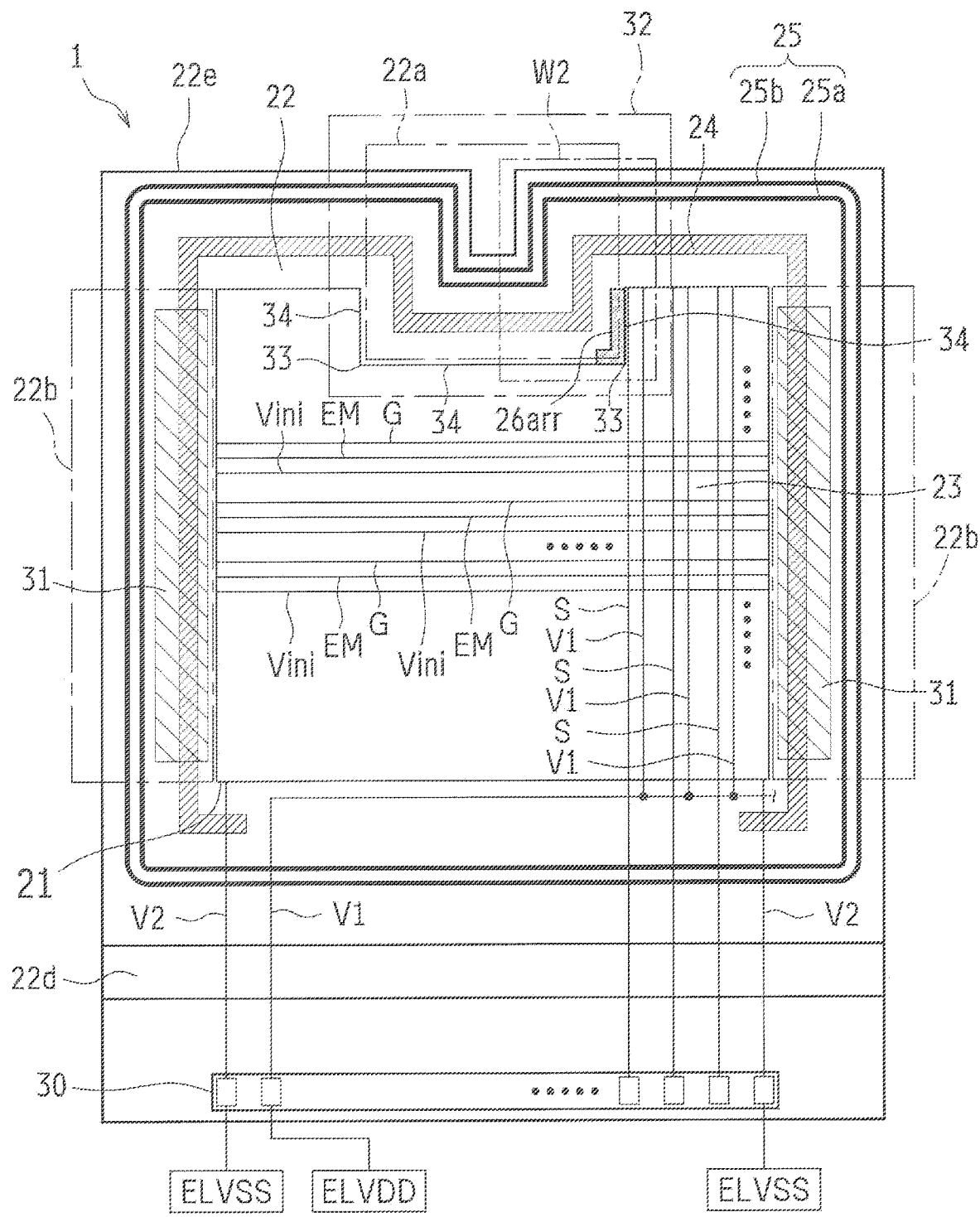
FIG. 7 schematically illustrates the overall structure of the display device 1 according to a second embodiment.
Figure 8:
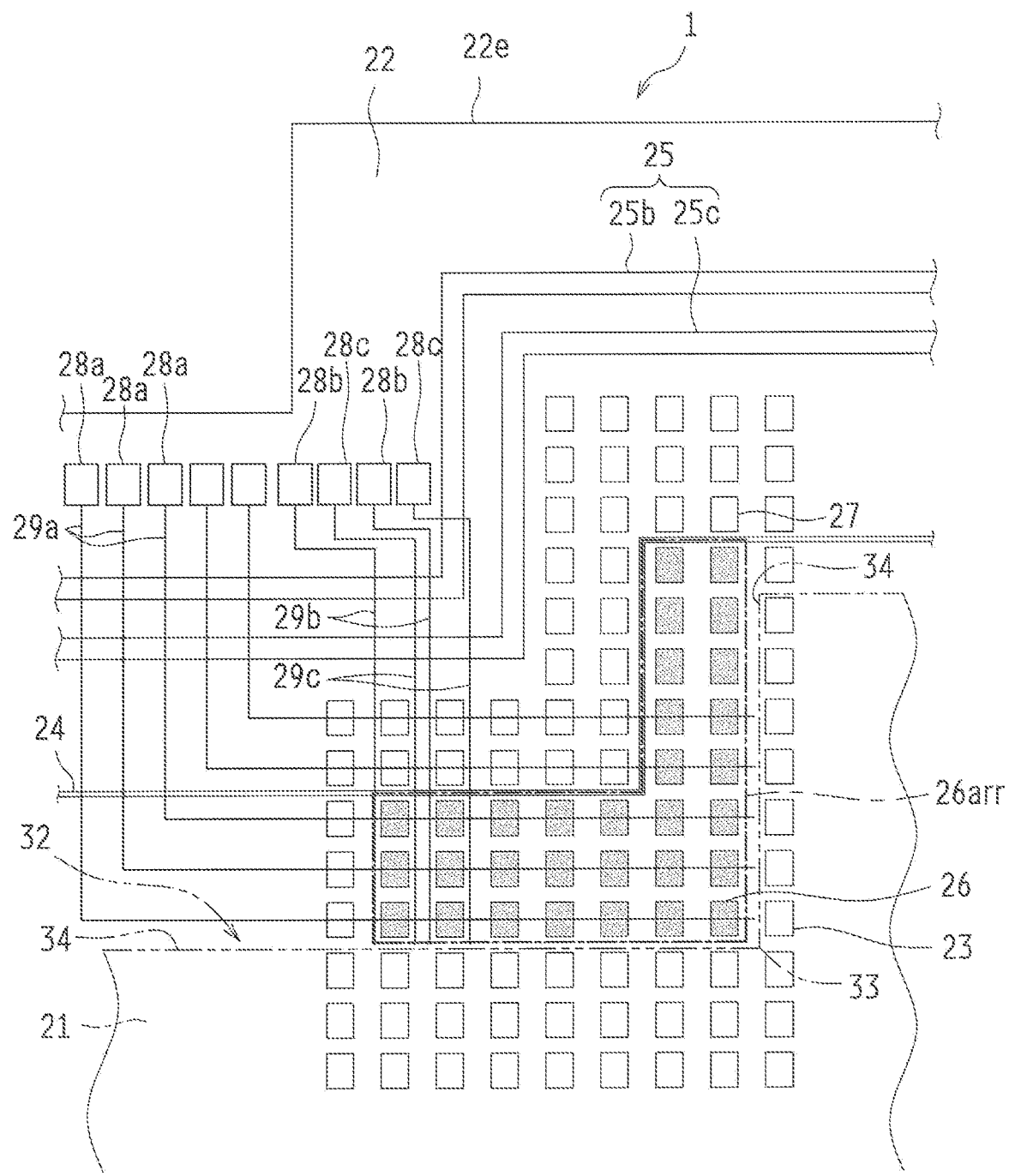
FIG. 8 is an enlarged view of a region W2, which is denoted by a dot-dashed line in FIG. 7.

FIG. 8 is an enlarged view of a region W2, which is denoted by a dot-dashed line in FIG. 7.

FIG. 8 shows the dummy pixel circuits 27 disposed between the trench 24 and barrier wall 25 in the notch region 32, and between the display region 21 and trench 24 in the notch region 32. FIG. 8 also shows the TEG patterns 26 disposed between the display region 21 and trench 24 in the notch region 32.

The TEG patterns 26 in this embodiment are disposed near a corner 33 where the outline forming the notch 34 protrudes toward the display region 21.

FIG. 8 shows a plurality of TEG patterns 26 arranged in the TEG pattern region 26arr, which is denoted by a dot-dashed line forming an L-shape. The TEG patterns 26 may be thus parallel to the side which has a dented shape with the notch 34 formed. Here, like the TEG patterns 26 in FIG. 6, each TEG pattern 26 in the TEG pattern region 26arr in FIG. 8 is connected to the conductive wires 29a to 29c, and is connected to the corresponding pads 28a to 28c in the frame region 22 (the illustration of the pads 28a to 28c and conductive wires 29a to 29c is partly omitted in FIG. 8).

Figure 9:
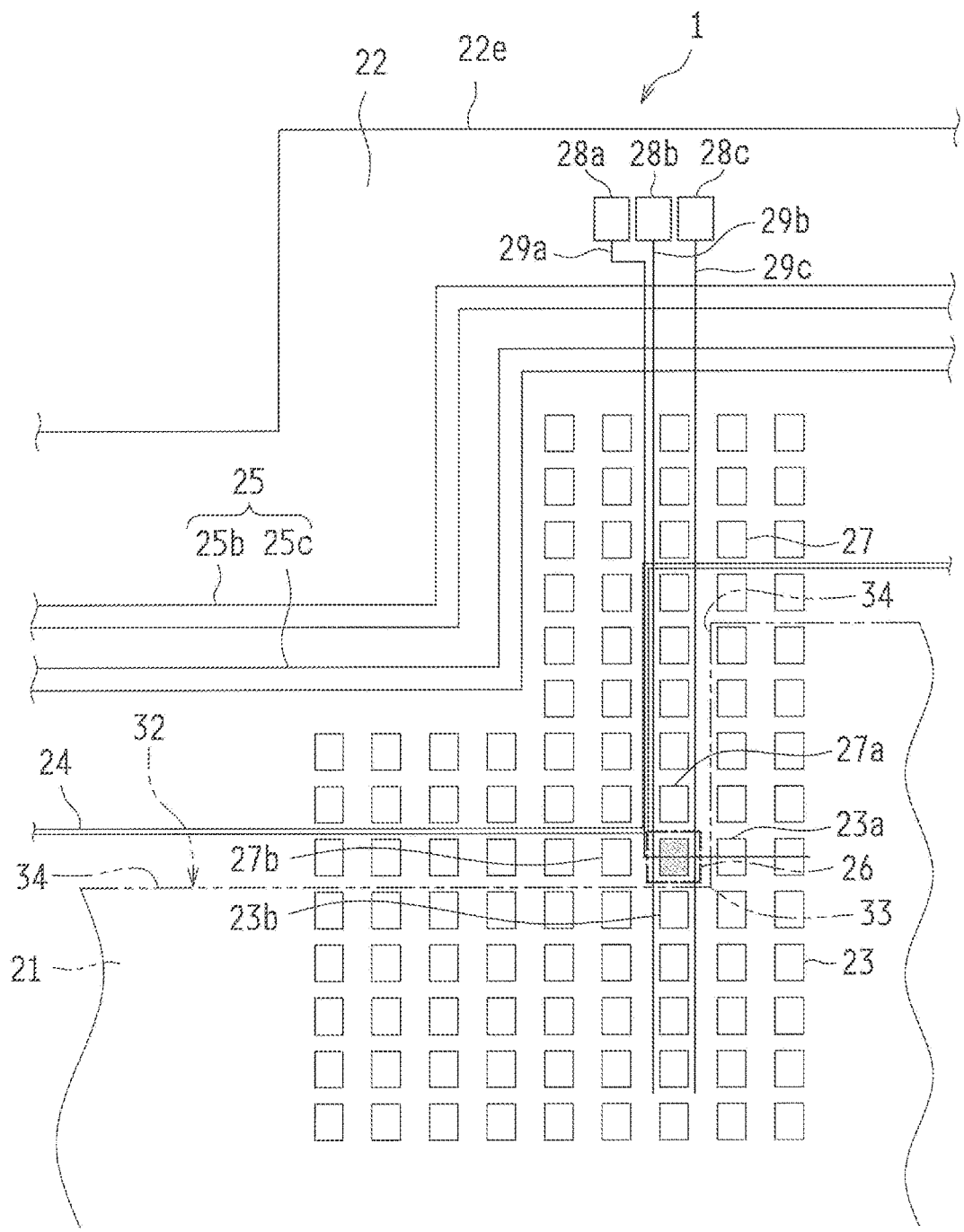
FIG. 9 illustrates another embodiment, where a region corresponding to the region W2, denoted by the dot-dashed line in FIG. 7, includes a single TEG pattern 26 adjacent to a corner 33 of a notch 34.

A single TEG pattern 26 can be placed in the corner 33 of the notch 34 so as to be adjacent to pixel circuits 23a and 23b, as illustrated in FIG. 9.

In this case, the display region 21 can have a maximum area size, with the TEG pattern 26 provided between the trench 24 and display region 21. Furthermore, the four sides of the TEG pattern 26, that is, the upper, lower, right and left sides, can be surrounded by the pixel circuits 23a and 23b and dummy pixel circuits 27a and 27b. This minimizes the number of TEG patterns 26 to be placed, and enables an influence exerted by the process for manufacturing surroundings of the TEG patterns 26 to be the same as that exerted by the process for manufacturing the pixel circuits 23 within the display region 21.

As such, forming the notch 34 in the display region 21 enables a characteristic change in the pixel circuits 23 to be accurately grasped from even a single TEG pattern 26, and enables the display region 21 to have a maximum area size.

The display according to the foregoing embodiments may be any display panel that includes display elements. The display elements include a display element the brightness and transmittance of which are regulated by current, and a display element the brightness and transmittance of which are regulated by voltage. Examples of a display element regulated by current include an organic electro luminescence (EL) display that has an organic light emitting diode (OLED), and a quantum-dot light-emitting diode (QLED) display that has an EL display QLED, such as an inorganic EL display that has an inorganic light emitting diode. An example of a display element regulated by voltage is a liquid-crystal display element.

In each of the foregoing embodiments, a second TEG pattern may be disposed in a region between the trench 24 and barrier wall 25, in addition to the TEG patterns 26. That is, a transistor structure that is the same as the TEG pattern 26 can be formed, as the second TEG pattern, in the region as well where the dummy pixel circuit 27 is disposed in FIG. 2. Providing the second TEG pattern enables the difference in element characteristic between the inside and outside of the trench 24 to be compared.

The invention claimed is:

1. A display device comprising:
   a substrate;
   a stack of a flattening film, a first electrode, an edge cover, and a second electrode, the stack being disposed on the substrate;
   a sealing layer disposed on the second electrode, the sealing layer including a first insulating sealing film, an organic film, and a second insulating sealing film;
   a display region; and
   a frame region surrounding the display region,
   wherein the display region includes a pixel circuit including a plurality of transistors,
   the frame region includes
      a trench disposed in the flattening film so as to surround the display region,
      a first conductive film electrically connected to the second electrode in the trench, the first conductive film being made of a material identical to a material of the first electrode, the first conductive film being disposed in a layer identical to a layer where the first electrode is disposed,
      a barrier wall defining an end of the organic film so as to surround an outside of the trench,
      a TEG pattern disposed between the display region and the trench, and
      a dummy pixel circuit disposed between the display region and the barrier wall, the dummy pixel circuit having a configuration identical to a configuration of the pixel circuit, the dummy pixel circuit including a transistor, and
   the TEG pattern is adjacent to at least the dummy pixel circuit.

2. The display device according to claim 1, wherein the TEG pattern is surrounded by the pixel circuit and the dummy pixel circuit.

3. The display device according to claim 1, wherein a pitch of arrangement of the pixel circuit and a pitch of arrangement of the dummy pixel circuit are equal.

4. The display device according to claim 1, wherein a pitch of arrangement of the pixel circuit, a pitch of arrangement of the dummy pixel circuit, and a pitch of arrangement of the TEG pattern are equal.

5. The display device according to claim 1, wherein the dummy pixel circuit is disposed between the trench and the barrier wall,
the TEG pattern is disposed between the trench and the display region, and
the dummy pixel circuit and the TEG pattern are disposed so as to sandwich the trench.

6. The display device according to claim 1, wherein the dummy pixel circuit is disposed also under the trench, and
the dummy pixel circuit under the trench is not in electrical contact with the first conductive film, the first conductive film being made of the material identical to the material of the first electrode, the first conductive film being disposed in the layer identical to the layer where the first electrode is disposed.

7. The display device according to claim 1, wherein the frame region further includes a terminal section capable of supplying a current to the display area, and
the TEG pattern is disposed, in the frame region, across the display region from the terminal section.

8. The display device according to claim 1, wherein the frame region further includes a control circuit, and
the control circuit is disposed in the frame region belonging to one side of the display region, the one side being different from another side of the display region located near the TEG pattern.

9. The display device according to claim 8, wherein the control circuit is disposed on both sides so as to sandwich the trench.

10. The display device according to claim 8, wherein the display region has a rectangular shape,
the frame region includes a terminal section disposed on a first side of the display region,
the TEG pattern is disposed on a second side of the display region, the second side being located across the display region from the first side, and
the control circuit is disposed on third and fourth sides of the display region.

11. The display device according to claim 1, wherein the display region has a side where a notch is disposed, the notch being composed of the display region partly cut into a dented shape,
the trench and the barrier wall are disposed along an outline of the notch,
the dummy pixel circuit is disposed between the trench and the barrier wall in the notch, and
the TEG pattern is disposed between the trench and the display region in the notch.

12. The display device according to claim 11, wherein the TEG pattern is disposed near a corner where the outline forming the notch protrudes toward the display region.

13. The display device according to claim 11, wherein the TEG pattern is parallel to the side which has the dented shape with the notch formed.

14. The display device according to claim 1, wherein a second TEG pattern is disposed in a region between the trench and the barrier wall.

15. The display device according to claim 1, wherein an inspection pad capable of supplying a voltage to the TEG pattern is disposed between the barrier wall and an end side of the frame region.

16. The display device according to claim 1, wherein the pixel circuit includes an organic EL element.

* * * * *